United States Patent [19]
Sasai et al.

[11] Patent Number: 5,619,520
[45] Date of Patent: Apr. 8, 1997

[54] SEMICONDUCTOR LASER

[75] Inventors: Yoichi Sasai, Hirakata; Nobuyuki Uemura, Takatsuki; Satoshi Kamiyama, Sanda; Minoru Kubo, Nabari; Takashi Nishikawa, Osaka, all of Japan

[73] Assignee: Matsushita Electric Industrial Co., Ltd., Osaka, Japan

[21] Appl. No.: 523,189

[22] Filed: Sep. 5, 1995

[30] Foreign Application Priority Data

Sep. 9, 1994 [JP] Japan ................................ 6-215956

[51] Int. Cl.$^6$ ........................................ H01S 3/18
[52] U.S. Cl. .................................. 372/46; 372/45
[58] Field of Search ............................ 372/45, 46

[56] References Cited

U.S. PATENT DOCUMENTS

| | | | |
|---|---|---|---|
| 5,404,027 | 4/1995 | Haase et al. | 372/45 |
| 5,475,237 | 12/1995 | Narui et al. | 372/45 |
| 5,519,722 | 5/1996 | Iwata | 372/46 |

OTHER PUBLICATIONS

Nakayama et al, "Continuous–Wave Operation of ZnMgSSe Based Blue–Green Laser Diodes Under High Temperature and High Output Power", Electronics Letters, 31 Mar. 1994, vol. 30, No. 7, pp. 568–569.

Salokatve et al, "Continuous–Wave, Room Temperature, Ridge Waveguide Green–Blue Diode Laser," Electronics Letters, 9 Dec. 1993, vol. 29, No. 25, pp. 2192–2193.

Haase et al, "Low–Threshold Buried–Ridge II–VI Laser Diodes", Appl. Physics, Lett. 63 (17), 25 Oct. 1993, pp. 2315–2317.

*Primary Examiner*—Rodney B. Bovernick
*Assistant Examiner*—Robert McNutt
*Attorney, Agent, or Firm*—Renner, Otto, Boisselle & Sklar, P.L.L.

[57] ABSTRACT

A semiconductor laser of this invention includes: a semiconductor substrate; a first cladding layer made of first conductivity type ZnMgSSe, which is held by the semiconductor substrate and lattice-matches with the semiconductor substrate; a stripe-shaped second cladding layer made of second conductivity type ZnMgSSe lattice-matching with the semiconductor substrate; a light-emitting layer including a first and a second light guiding layers made of $Zn_{1-x}Mg_xS_{1-y}Se_y$ ($0 \leq x < 1$, $0 \leq y < 1$) and a quantum well layer made of $Zn_{1-z}Cd_zSe$ ($0 \leq z < 1$) which is interposed between the first and the second light guiding layers, the light-emitting layer being interposed between the first and the second cladding layers; and a burying layer which is made of ZnMgSSe lattice-matching with the semiconductor substrate and formed on sides of the second cladding layer.

14 Claims, 8 Drawing Sheets

Refractive index of burying layer 26
a ——————— n=2.20
b —··—··—··— n=2.35
c —————— n=2.42
d ———————— n=2.50
e ————————— n=2.52
f —··—··—··— n=2.55

SEMICONDUCTOR LASER

BACKGROUND OF THE INVENTION

1. Field of the Invention

The present invention relates to a semiconductor laser which emits a light beam having a wavelength in a green-blue region.

2. Description of the Related Art

Recently, in order to increase the density of an optical disc and enhance the resolution of a laser printer, a semiconductor laser having a short wavelength has been expected. As a semiconductor light-emitting element which emits a light beam having a short wavelength, such as a blue or green light beam, a semiconductor laser using a ZnSe type II–VI compound semiconductor has been widely studied and developed.

Figure 9:
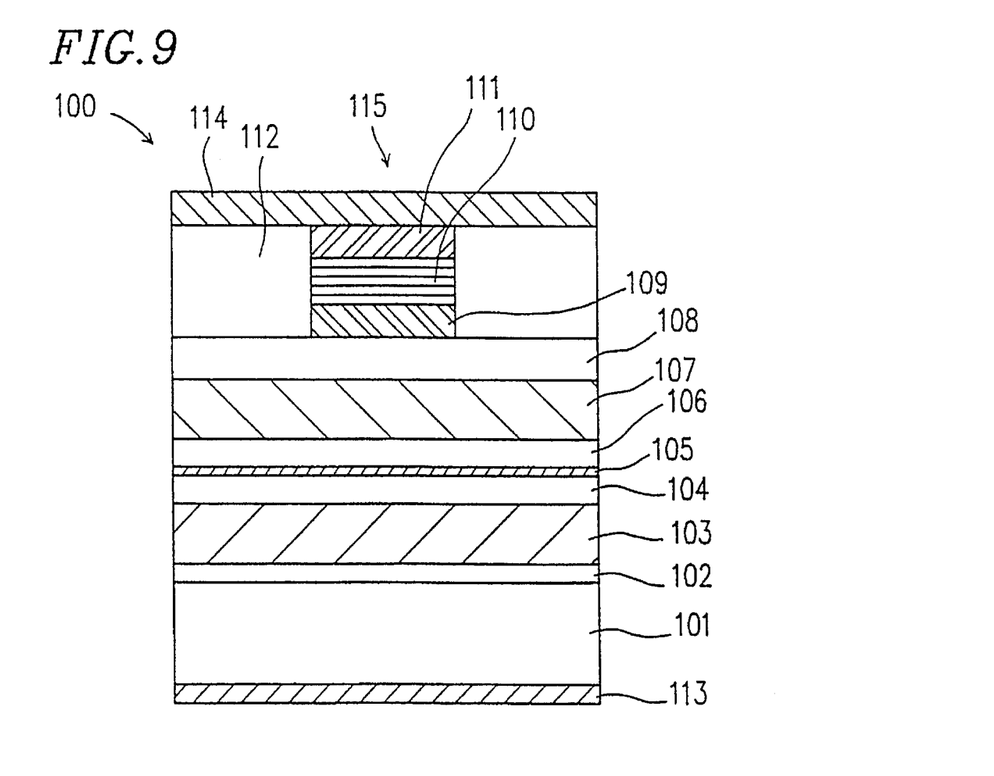
FIG. 9 shows a cross-sectional structure of a conventional semiconductor laser.

For example, a gain waveguide type semiconductor laser as shown in FIG. 9 is reported in Electronics Letters, 31 Mar. 1994, Vol. 30, pp.568 to 569.

A semiconductor laser 100 shown in FIG. 9 includes: a multi-quantum well layer 105 made of ZnCdSe; a pair of light confinement layers 104 and 106 respectively made of p-type ZnSSe and n-type ZnSSe, sandwiching the multi-quantum well layer 105 therebetween; and a pair of cladding layers 103 and 107 respectively made of p-type ZnMgSSe and n-type ZnMgSSe, sandwiching the light confinement layers 104 and 106 therebetween. The above structure is formed on a buffer layer 102 made of ZnSSe which is formed on a GaAs substrate 101. On the cladding layer 107, a p-type ZnSSe layer 108, a p-type ZnSe layer 109, a multi-quantum well layer 110 made of p-type ZnSe and p-type ZnTe, and a contact layer 111 made of p-type ZnTe are deposited in this order. The p-type ZnSe layer 109, the multi-quantum well layer 110 and the contact layer 111 are etched into a striped shape to form a striped structure 115. Both sides of the striped structure 115 are buried by insulating layers 112. Electrodes 113 and 114 are formed on the bottom face of the GaAs substrate 101 and the upper surface of the contact layer 111, respectively.

In the semiconductor laser 100, a current flowing into the multi-quantum well layer 105 is allowed to be distributed by the striped structure 115 so as to form carrier distribution in the multi-quantum well layer 105, thereby controlling a lateral mode.

Moreover, Electronics Letters, 9 Dec. 1993, Vol. 29, pp.2192 to 2193 has reported that a ridge refractive index type semiconductor laser having both sides of a ridge buried by insulating films, continuously oscillates at room temperature. Furthermore, Appl. Phys. Lett. 63(17), 25 Oct. 1993, pp. 2315 to 2317 has reported that a ridge refractive index type semiconductor laser using polycrystalline ZnS as a burying layer, oscillates in pulse at room temperature.

In a semiconductor laser, it is important to appropriately control a lateral mode of an oscillating laser light beam for realizing stable oscillation in a single mode. Although a lateral mode is controlled by using a gain waveguide mechanism or a refractive index waveguide mechanism in a conventional semiconductor laser described above, continuous oscillation of a stable single mode has not been realized yet. The reason for this is as follows. Since the combinations in group II–V compound semiconductors, with which a semiconductor layer having good crystal quality can be formed, are limited in the current techniques, it is difficult to manufacture a stripe-shaped semiconductor structure whose sides are buried by using a suitable material so as to realize a gain waveguide mechanism or a refractive index waveguide mechanism.

Although a burying layer made of silicon oxide, aluminum oxide, polycrystalline ZnS or the like is used in the above conventional examples, these materials are not generally preferred as materials for a semiconductor laser.

The reasons for this are as follows. Since these burying layers have a large heat resistance, these burying layers cannot sufficiently conduct the heat generated in the active layer. Therefore, the semiconductor laser is deteriorated over time, resulting in a decrease in reliability of the semiconductor laser. Moreover, since it is generally difficult to deposit a thin film made of these materials on order of several µm, it is difficult to bury a large step difference. Thus, it is difficult to flatten the upper surface of the semiconductor laser. Accordingly, it is also difficult to mount the semiconductor laser facedown.

SUMMARY OF THE INVENTION

A semiconductor laser of this invention, includes: a semiconductor substrate; a first cladding layer made of a first conductivity type ZnMgSSe, which is held by the semiconductor substrate and lattice-matches with the semiconductor substrate; a stripe-shaped second cladding layer made of a second conductivity type ZnMgSSe lattice-matching with the semiconductor substrate; a light-emitting layer including a first and a second light guiding layers made of $Zn_{1-x}Mg_xS_{1-y}Se_y$ ($0 \leq x < 1$, $0 \leq y < 1$) and a quantum well layer made of $Zn_{1-x}Cd_xSe$ ($0 \leq z < 1$) which is interposed between the first and the second light guiding layers, the light-emitting layer being interposed between the first and the second cladding layers; and a burying layer which is made of ZnMgSSe lattice-matching with the semiconductor substrate and formed on sides of the second cladding layer.

In one embodiment of the present invention, the semiconductor laser further includes a third cladding layer which is made of the second conductivity type ZnMgSSe lattice-matching the semiconductor substrate and provided between the second cladding layer and the light-emitting layer.

According to another aspect of the invention, the semiconductor laser includes: a semiconductor substrate; a first cladding layer made of a first conductivity type ZnMgSSe, which is held by the semiconductor substrate and lattice-matches with the semiconductor substrate; a second cladding layer including a stripe-shaped ridge, which is made of a second conductivity type ZnMgSSe lattice-matching with the semiconductor substrate; a light-emitting layer having a first and a second light guiding layers made of $Zn_{1-x}Mg_xS_{1-y}Se_y$ ($0 \leq x < 1$, $0 \leq y < 1$) and a quantum well layer made of $Zn_{1-z}Cd_zSe$ ($0 \leq z < 1$) which is interposed between the first and the second light guiding layers, the light-emitting layer being interposed between the first and the second cladding layers; and a burying layer which is made of ZnMgSSe lattice-matching with the semiconductor substrate and formed on sides of the second cladding layer.

In one embodiment of the present invention, the burying layer is made of undoped ZnMgSSe.

In another embodiment of the present invention, the burying layer has a refractive index smaller than that of the second cladding layer.

In still another embodiment of the present invention, the second cladding layer has a width in a range of 1 µm to 2.5 µm in a direction perpendicular to a direction in which the stripe-shaped second cladding layer extends, and a difference in effective refractive index between a region below the second cladding layer and the other region in the light-emitting layer is $4.0 \times 10^{-3}$ or less.

In still another embodiment of the present invention, the second cladding layer has a width in a range of 1 μm to 2 μm in a direction perpendicular to a direction in which the stripe-shaped second cladding layer extends, and a difference in effective refractive index between a region below the second cladding layer and the other region in the light-emitting layer is $1.0 \times 10^{-2}$ or less.

In still another embodiment of the present invention, the second cladding layer has a width in a range of 1 μm to 4 μm in a direction perpendicular to a direction in which the stripe-shaped second cladding layer extends, and a difference in effective refractive index between a region below the second cladding layer and the other region in the light-emitting layer is $2.0 \times 10^{-3}$ or less.

In still another embodiment of the present invention, the semiconductor laser further includes a ZnSe layer between the second cladding layer and the third cladding layer.

In still another embodiment of the present invention, the first and the second cladding layers are made of $Zn_{1-x'}S_{1-y'}Se_{y'}$ ($0 \leq x' < 1$, $0 \leq y' < 1$) and satisfy $x < x'$ and $y > y'$.

In still another embodiment of the present invention, the first, the second and the third cladding layers are made of $Zn_{1-x'}S_{1-y'}Se_{y'}$ ($0 \leq x' < 1$, $0 \leq y' < 1$) and satisfy $x < x'$ and $y > y'$.

In still another embodiment of the present invention, the first and the second cladding layers have a band gap which is larger than that of the first and the second light guiding layers by 0.15 eV or more.

In still another embodiment of the present invention, the first, the second and the third cladding layers have a band gap which is larger than that of the first and the second light guiding layers by 0.15 eV or more.

In still another embodiment of the present invention, the quantum well layer is made of CdZnSe, and the first and the second light guiding layers are made of $ZnS_{0.07}Se_{0.93}$.

Thus, the invention described herein makes possible the advantage of providing a refractive index waveguide type semiconductor laser with high reliability, which is capable of being mounted facedown, operating with a low threshold value current density and continuously oscillating in a single mode.

This and other advantages of the present invention will become apparent to those skilled in the art upon reading and understanding the following detailed description with reference to the accompanying figures.

DESCRIPTION OF THE PREFERRED EMBODIMENTS

Hereinafter, examples of the present invention will be described by way of illustrative drawings.

EXAMPLE 1

Figure 1:
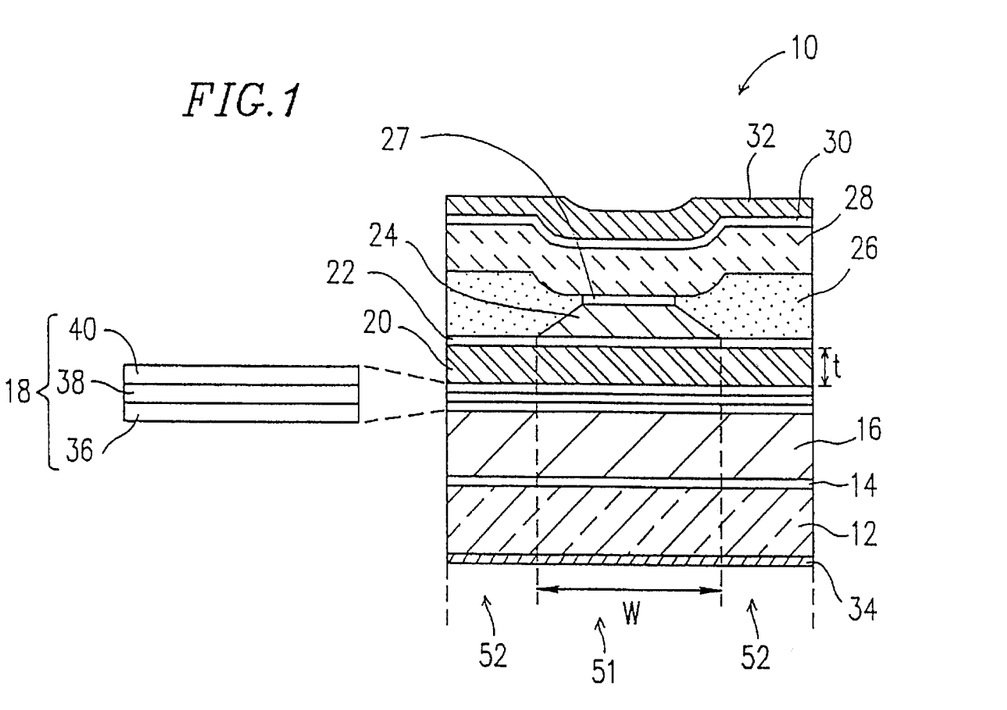
FIG. 1 schematically shows a cross-sectional structure of a semiconductor laser according to Example 1 of the present invention.

FIG. 1 schematically shows a cross-section of a semiconductor laser 10 according to the present invention. The semiconductor laser 10 includes: a semiconductor substrate 12 made of n-type GaAs; an n-type first cladding layer 16 carried by the semiconductor substrate 12 through a buffer layer 14; a strip-shaped p-type second cladding layer 24; and a light-emitting layer 18 interposed between the first cladding layer 16 and the second cladding layer 24.

A light-emitting layer 18 includes a quantum well layer 38, and a first light guiding layer 36 and a second light guiding layer 40 sandwiching the quantum well layer 38 therebetween. The light-emitting layer 18 emits a light beam having a wavelength of 520 nm. A p-type third cladding layer 20 covering the upper surface of the light-emitting layer 18 and a ZnSe layer 22 are provided between the light-emitting layer 18 and the second cladding layer 24. The upper surface of the third cladding layer 20 is covered with the ZnSe layer 22.

Undoped burying layers 26 are provided on both sides of the second cladding layer 24, covering the upper face of the ZnSe layer 22 and the side faces of the second cladding layer 24. A first cap layer 27 is formed on the second cladding layer 24. A second cap layer 28 and a contact layer 30 are successively formed on the first cap layer 27 and the burying layer 26 which are formed on the second cladding layer 24. Electrodes 32 and 34 are formed on the upper face of the contact layer 30 and the bottom face of the semiconductor substrate 12, respectively. An example of a composition, a concentration of impurity and a thickness of each semiconductor layer will be shown in Table 1 below.

In the semiconductor laser 10, although the upper part of the second cladding layer 24 is slightly concave as shown in FIG. 1, the top surface of the burying layer 26 is substantially smooth.

The semiconductor laser 10 has a refractive index waveguide type structure, and controls confinement of a light beam emitted from the light-emitting layer 18 in a lateral direction based on a difference in effective refractive index between a region 51 below the second cladding layer 24 included in the light-emitting layer 18 and other regions 52. As described below in detail, the lateral mode of an emitted light beam is controlled to be a single mode in the semiconductor laser 10 by controlling a width W of the region 51 and a difference in effective refractive index between the region 51 and the regions 52.

TABLE 1

| Semiconductor layer | Composition | Thickness | Concentration of impurity |
|---|---|---|---|
| Buffer layer 14 | n-ZnSe | 10 nm | $1 \times 10^{19}$ |
| First cladding layer 16 | n-$Zn_{0.83}Mg_{0.17}S_{0.2}Se_{0.8}$ | 1 μm | $5 \times 10^{17}$ |
| Light-emitting layer 18 | | | |
| First light guiding layer 36 | u-$ZnS_{0.07}Se_{0.93}$ | 70 nm | |
| Quantum well layer 38 | u-$Zn_{0.8}Cd_{0.2}Se$ | 6 nm | |
| Second light guiding layer 40 | u-$ZnS_{0.07}Se_{0.93}$ | 70 nm | |
| Third cladding layer 20 | p-$Zn_{0.83}Mg_{0.17}S_{0.2}Se_{0.8}$ | 100 nm | $3 \times 10^{17}$ |
| ZnSe layer 22 | p-ZnSe | 5 nm | $5 \times 10^{17}$ |
| Second cladding layer 24 | p-$Zn_{0.83}Mg_{0.17}S_{0.2}Se_{0.8}$ | 0.6 μm | $3 \times 10^{17}$ |
| Burying layer 26 | u-$Zn_{0.83}Mg_{0.17}S_{0.2}Se_{0.8}$ | 1 μm | $5 \times 10^{17}$ |
| First cap layer 27 | p-$ZnS_{0.07}Se_{0.93}$ | 10 nm | $5 \times 10^{17}$ |
| Second cap layer 28 | p-$ZnS_{0.07}Se_{0.93}$ | 0.2 μm | $5 \times 10^{17}$ |
| Contact layer 30 | p-ZnSe/p-ZnTe | 30 nm | $1 \times 10^{18}$ |

First, a method for fabricating the semiconductor laser 10 will be described with reference to FIGS. 1 and 2A through 2H.

Figure 2A:
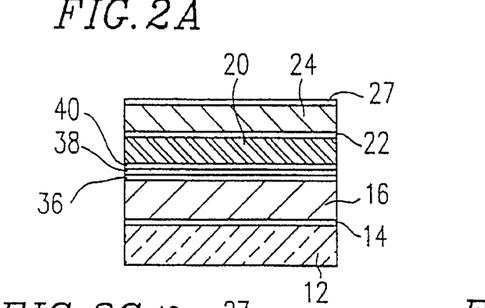
FIGS. 2A to 2I are cross-sectional views showing the processes of fabricating the semiconductor laser shown in FIG. 1.

As shown in FIG. 2A, the buffer layer 14, the first cladding layer 16, the first light guiding layer 36, the quantum well layer 38, the second light guiding layer 40, the third cladding layer 20, the ZnSe layer 22, the second cladding layer 24, and the first cap layer 27 are successively grown on the n-type GaAs semiconductor substrate 12 having a (100) plane by epitaxial growth such as molecular beam epitaxy (MBE). Since the semiconductor layers other than the quantum well layer 38 and the buffer layer 14 lattice-match with the semiconductor substrate 12, an excellent semiconductor layer having little lattice defects and the like can be obtained. The quantum well layer 38 does not lattice-match with the semiconductor substrate 12. However, since the quantum well layer 38 is sufficiently thin, it can be formed on the first light guiding layer 36 without causing a lattice defect or misfit dislocation while containing strains therein.

Figure 2B:
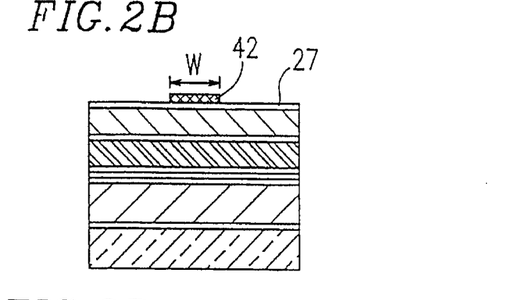

Next, as shown in FIG. 2B, a silicon oxide film 42 is formed on the first cap layer 27 by light-assisted CVD or the like. The silicon oxide film 42 has a stripe-shaped portion whose width W defines the width of the second cladding layer 24. In Example 1, a width W is set at 1.5 μm. The silicon oxide film 42 is formed so as to extend in a [110] direction or in a direction which is perpendicular to a [110] direction.

Figure 2C:
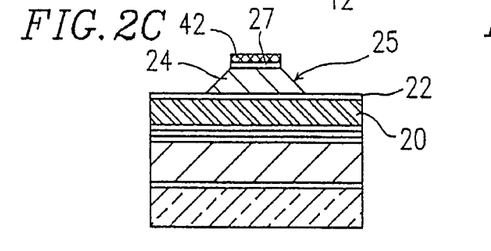

As shown in FIG. 2C, the first cap layer 27 is etched using a mixed solution of potassium dichromate and sulfuric acid by using the silicon oxide film 42 as a mask. Furthermore, the second cladding layer 24 is etched to a depth of about 0.5 μm. Next, the remaining portion of the second cladding layer 24 is etched using a hydrochloric acid type etchant so as to expose the surface of the ZnSe layer 22. As a result, the stripe-shaped second cladding layer 24 is formed.

In Example 1, the ZnSe layer 22, which serves as an etching stopper layer when the second cladding layer 24 is etched into a striped shape, is provided between the second cladding layer 24 and the third cladding layer 20. However, the ZnSe layer 22 is not necessarily required. As is apparent to those skilled in the art, since the second cladding layer 24 and the third cladding layer 20 are made of the same semiconductor, the same structure is obtained by forming these layers as a single layer and controlling an etching time period while using the silicon oxide film 42 as a mask.

Side faces 25 of the second cladding layer 24 exhibit (221) planes due to wet etching. However, it is not necessarily required to form the side faces 25 having the planes. Instead of the above method, the following method may be used. The second cladding layer 24 may be etched to a depth of about 0.5 μm by anisotropic etching such as dry etching using a mixed gas including chlorine, hydrogen and xenon (Xe) or a mixed gas including chlorine, hydrogen and argon (Ar) using the silicon oxide film 42 as a mask. Then, the remaining portion is etched with a chlorine type etchant so as to form the perpendicular side faces 25. In the case where the side faces 25 are not perpendicularly formed, however, the width W of the silicon oxide film 42 and the width of the bottom face of the second cladding layer 24 may differ from each other. Therefore, it is necessary to take the difference of width into consideration.

Figure 2D:
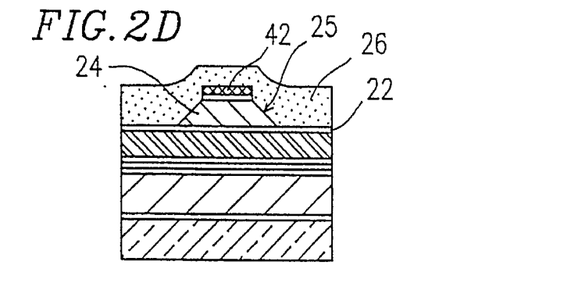

Next, the burying layer 26 is formed. Specifically, a native oxide film present on the surface of the ZnSe layer 22 is removed by wet etching, and therefore the surface of the ZnSe layer 22 is cleaned. Thereafter, the semiconductor substrate 12 is placed in an MBE apparatus again as shown in FIG. 2D, and then the burying layer 26 is epitaxially grown on the exposed ZnSe layer 22. Since the burying layer 26 is made of ZnMgSSe which lattice-matches with ZnSe, the burying layer 26 having good crystal quality, in which lattice defect or misfit dislocation scarcely occurs, can be formed. The burying layer 26 is grown until the surface of the silicon oxide film 42 is completely covered.

Figure 2E:
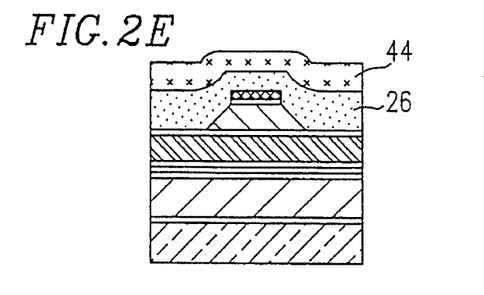
Figure 2F:
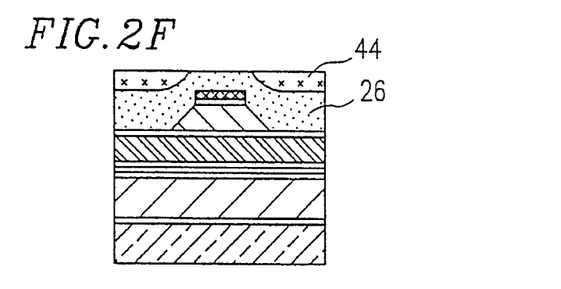
Figure 2G:
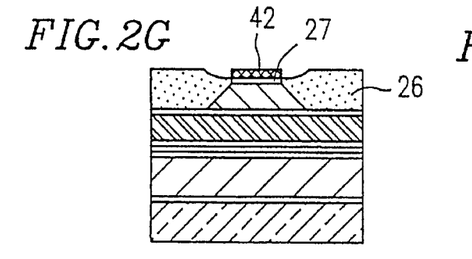

Thereafter, as shown in FIG. 2E, a resist film 44 is formed on the entire surface of the burying layer 26. Then, the resist film 44 is etched from the entire upper surface by oxygen plasma or the like so that the burying layer 26 formed on the silicon oxide film 42 is partially exposed (FIG. 2F). The burying layer 26 is etched using a mixed solution of potassium dichromate and sulfuric acid while using the resist film 44 as a mask so as to remove the burying layer 26 on the silicon oxide film 42 as shown in FIG. 2G.

Figure 2H:
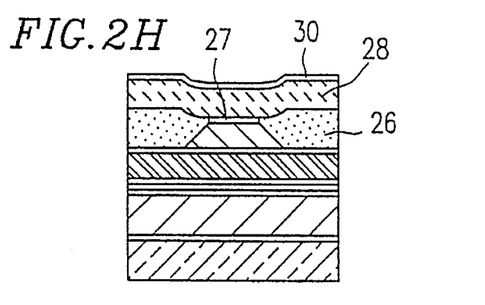

After the first cap layer 27 is exposed by removing the silicon oxide film 42 with aqueous hydrofluoric acid or the like, the semiconductor substrate 12 is placed in the MBE apparatus again. Then, as shown in FIG. 2H, the second cap layer 28 and the contact layer 30 are epitaxially grown on the burying layer 26 and the first cap layer 27 in this order.

Finally, as shown in FIG. 1, for example, an AuGeNi type or an In metal film is formed as the electrode 34, and a PdPtAu type metal film is vapor deposited as the electrode 32. Then, a thermal treatment is conducted if necessary, thereby completing the semiconductor laser 10.

Figure 2I:
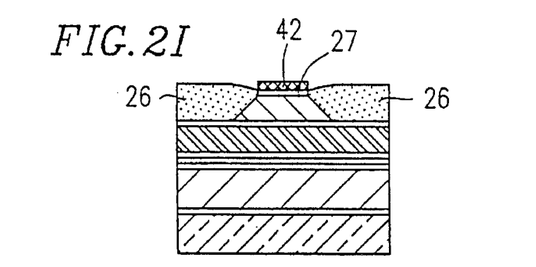

In the above fabrication method, the burying layer 26 is formed by an MBE method. However, the burying layer 26 can be formed by using a metalorganic vapor phase epitaxy (MOVPE) method. In this case, since the burying layer 26 is selectively grown on the ZnSe layer 22 alone and is not grown on the silicon oxide film 42, the structure shown in FIG. 2I is directly obtained if the burying layer 26 is formed after the step shown in FIG. 2C.

Specifically, as shown in FIG. 2C, after the second cladding layer 24 is etched into a stripe-shape, the semiconductor substrate 12 is introduced into an MOVPE apparatus. The burying layer 26 is grown at 400° C. under atmospheric pressure using bismethyl cyclopentadienyl magnesium ((MeCp)$_2$Mg) as a magnesium source, dimethylzinc (DMZn) as a zinc source, dimethylselenium (DMSe) as a selenium source and diethylsulfur (DES) as a sulfur source while flowing hydrogen as a carrier gas at 2l/min. By introducing DMZn, DMSe and DES at 1 to 8×10$^{-5}$ mol/min, respectively, and (MeCp)$_2$Mg at 2×10$^{-7}$ mol/min into the MOVPE apparatus, the burying layer 26 having desired compositions can be formed as shown in FIG. 2I. After the silicon oxide film 42 is removed using hydrofluoric acid and the like, the second cap layer 28 and the contact layer 30 are grown by an MBE method or an MOVPE method as shown in FIG. 2H. In the case where the MOVPE method is used, by introducing DMZn, DMSe and DES at 1×10$^{-5}$ mol/min, 3×10$^{-5}$ mol/min, and 8×10$^{-5}$ mol/min, respectively, and t-butylamine (t-BNH$_2$) as a nitrogen source serving as a dopant at 1×10$^{-4}$ mol/min into the MOVPE apparatus, the structure shown in FIG. 2H is obtained.

Hereinafter, the structure for realizing a single lateral mode in the semiconductor laser 10 will be described in detail.

In order to control the lateral mode of a light beam emitted from the light-emitting layer 18 in the semiconductor laser 10, a difference in effective refractive index between a light-emitting central portion and portions sandwiching the light-emitting central portion should be obtained. Then, a length of the light-emitting central portion in a horizontal direction at the obtained difference in effective refractive index is obtained, thereby determining the conditions of the lateral mode.

Figure 3:
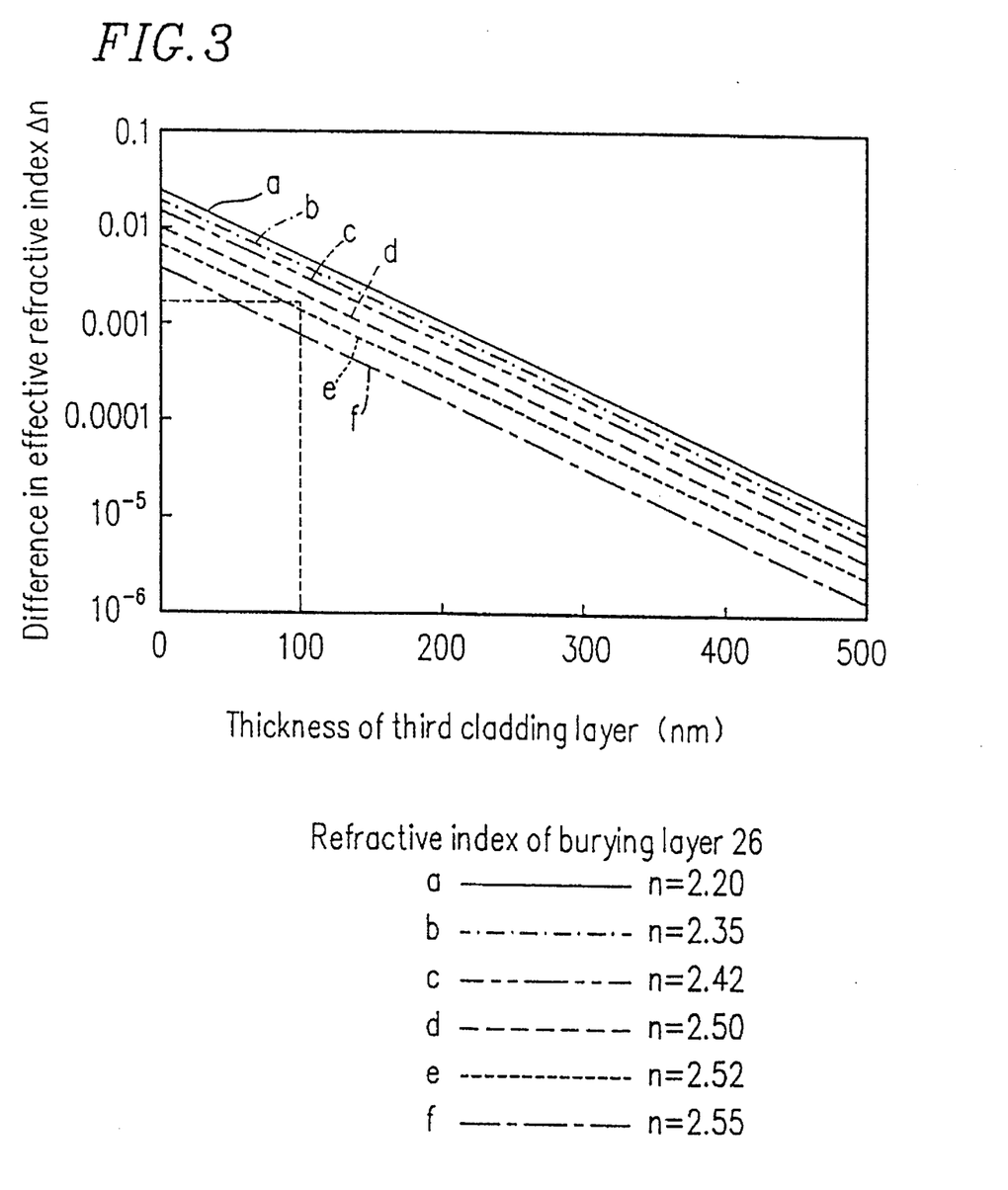
FIG. 3 is a graph showing the relationship between a difference in effective refractive index between a region below a second cladding layer included in a light-emitting layer and the other regions, and a thickness of a third cladding layer.

FIG. 3 is a graph showing the relationship between a difference in effective refractive index between the region 51 (FIG. 1) below the second cladding layer 24 and the other regions 52 of the second cladding layer in the light-emitting layer 18, which is calculated based on an effective refractive index method, and a thickness t of the third cladding layer. The ordinate represents a difference in effective refractive index Δn, and the abscissa represents the thickness t.

When compositions x and y of $Zn_{1-x}Mg_xS_{1-y}Se_y$ constituting the burying layer 26 are changed, the refractive index of the burying layer 26 changes. In FIG. 3, a solid line a represents the case where a refractive index is 2.20, and broken lines b through f represent the cases where refractive indices are 2.35, 2.42, 2.50, 2.52 and 2.55, respectively. As the thickness t of the third cladding layer 20 is changed, the difference in effective refractive index Δn changes. As shown in FIG. 3, as the thickness t increases, the difference in effective refractive index Δn decreases. In the case where a refractive index of the burying layer 26 is small (the solid line a and the broken line b in FIG. 3), the difference in effective refractive index is large.

When the compositions x and y of the burying layer 26 are about 0.21 and about 0.76, respectively, in the above described structure, a refractive index of the burying layer 26 is about 2.52 (the broken line e in FIG. 3). Since a thickness of the third cladding layer 20 is 100 nm (1000 angstroms), it is understood from the broken line e that a difference in effective refractive index for the refractive index of 2.52 is about 2×10$^{-3}$.

Figure 4:
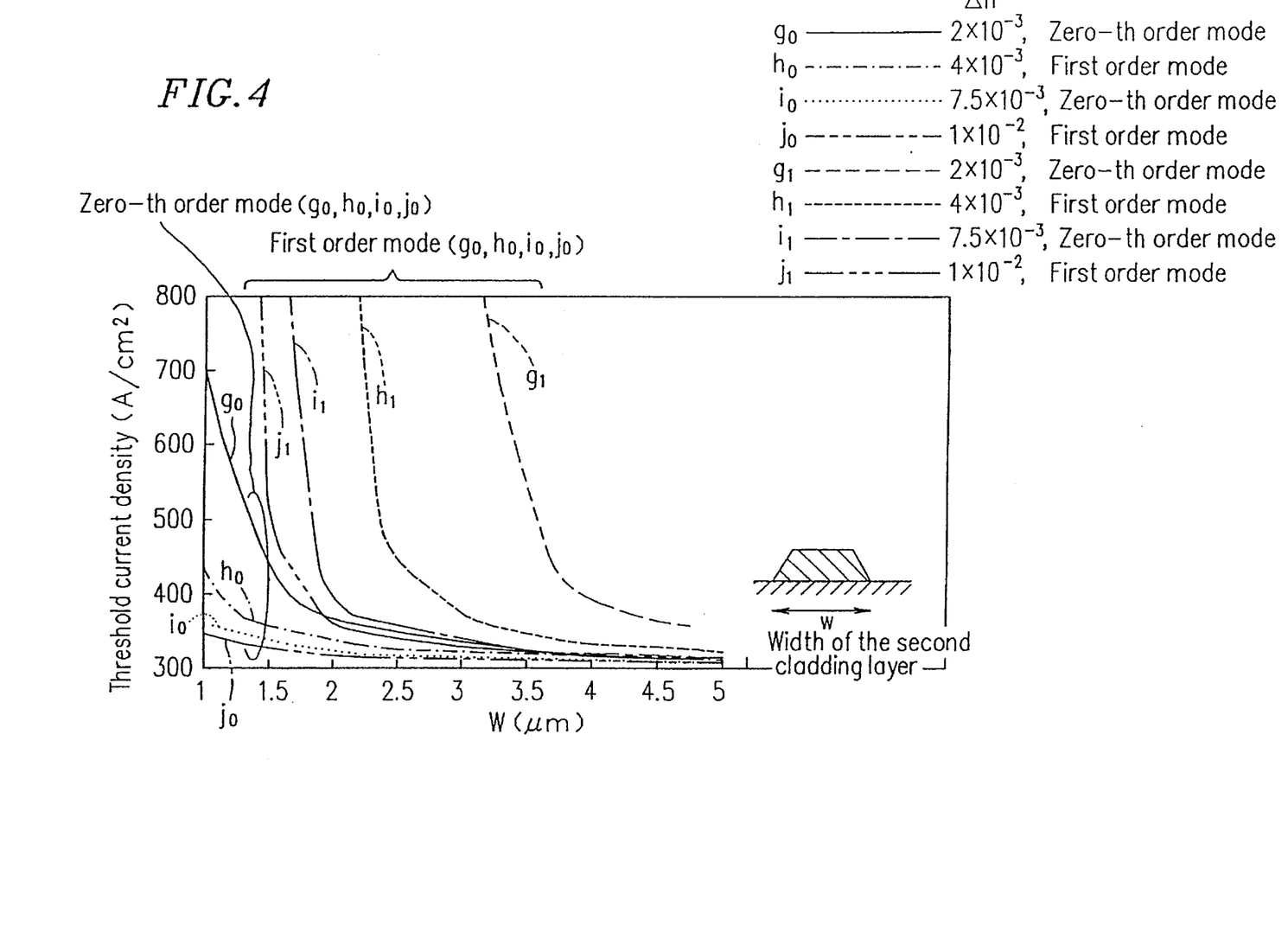
FIG. 4 is a graph showing the relationship between a width of a second cladding layer and a threshold value current density under lateral mode conditions of a semiconductor laser according to examples of the present invention.

FIG. 4 shows the relationship between a width W of the second cladding layer 24 when a zero-th mode (so-called single mode) and a first mode (so-called multi mode) are obtained and a threshold value current density of the semiconductor laser 10 when a threshold gain is set at 20 cm$^{-1}$ while a difference in effective refractive index is changed. In FIG. 4, curves $g_0$, $h_0$, $i_0$ and $j_0$ represent conditions with which a zero-th mode is obtained, and curves $g_1$, $h_1$, $i_1$ and $j_1$ represent conditions with which a first mode is obtained. The curves $g_0$ and $g_1$, $h_0$ and $h_1$, $i_0$ and $i_1$, and $j_0$ and $j_1$ represent the cases where differences in effective refractive index are 2×10$^{-3}$, 4×10$^{-3}$, 7.5×10$^{-3}$ and 1×10$^{-2}$, respectively.

As is apparent from FIG. 4, it is understood that the width W should be shortened so that the semiconductor laser oscillates at the same threshold value density when the difference in effective refractive index becomes large. Moreover, if the differences in effective refractive index are the same, the width W should be shortened so that the zero-th mode alone is present. For example, in the case where a difference in effective refractive index is 2×10$^{-3}$ and the semiconductor laser is driven at a threshold value current density of 400 A/cm$^2$, it is understood from the curve $g_0$ that a width W should be 1.7 μm to satisfy the conditions of the zero-th mode. Since the first order mode (curve $g_1$) is present at a threshold value density exceeding 800 A/cm$^2$ by far, the semiconductor laser stably oscillates in a single mode.

Moreover, in the case where a difference in effective refractive index is set at 4×10$^{-3}$ and a width W is set at 4 μm, threshold value current densities at which a zero-th order mode and a first order mode are obtained as 330 A/cm$^2$ and 350 A/cm$^2$ from the curves $h_0$ and $h_1$, respectively. In this case, if the semiconductor laser perfectly stably oscillates at a current density of 330 A/cm$^2$, the semiconductor laser is allowed to oscillate in a single mode. However, if the current density varies and exceeds 350 A/cm$^2$ to satisfy the conditions of the first order mode, the semiconductor laser undesirably oscillates in a multi-mode.

Therefore, in order that the semiconductor laser stably operates in a single mode, it is advantageous that the difference in effective refractive index is large.

As described above with reference to FIG. 3, in the case where a refractive index of the burying layer 26 is set at 2.52 and a thickness of the third cladding layer 20 is set at 100 nm, the difference in effective refractive index obtained is about 2.0×10$^{-3}$ from FIG. 3. It is understood from the curves $g_0$ and $g_1$ in FIG. 4 that the width W with which a single mode is obtained is about 4 μm. This value satisfies the conditions of the zero-th order mode, but not the conditions of the first order mode.

Therefore, in the case where a width of the second cladding layer is set at 2 μm in the above-mentioned semiconductor laser 10, stable single mode oscillation can be realized. At this time, a threshold value density is about 310 A/cm$^2$. Therefore, it is understood that the semiconductor laser can be driven at a low current.

As is apparent from FIG. 4, since the semiconductor is more stably operated in a single mode with a shorter width W, the width W is preferably short. If the width W is shortened, the series resistance in the semiconductor laser is increased and the width of the stripe-shaped portion is thinned. As a result, it becomes difficult to process the second cladding layer 24. In consideration of these points, the width should be 1 μm or more. In this case, the difference in effective refractive index should be less than 1×10$^{-2}$.

Since the difference in effective refractive index is set at 1×10$^{-2}$ or less, it is possible to control the width of the stripe-shaped portion to a value with which a single mode is easily obtained by controlling the composition of the burying layer 26 to adjust the refractive index of the burying layer 26 and adjusting the thickness t of the third cladding layer 20.

The following is understood from FIG. 4. In order that the semiconductor laser is allowed to oscillate in a single mode, it is sufficient that the width W is 1 µm≦W≦2 µm when a difference in effective refractive index is 1×10⁻², and it is sufficient that the width W is 1 µm≦W≦4 µm when a difference in effective refractive index is 2×10⁻³. The width W can be set based on FIG. 4.

EXAMPLE 2

Figure 5:
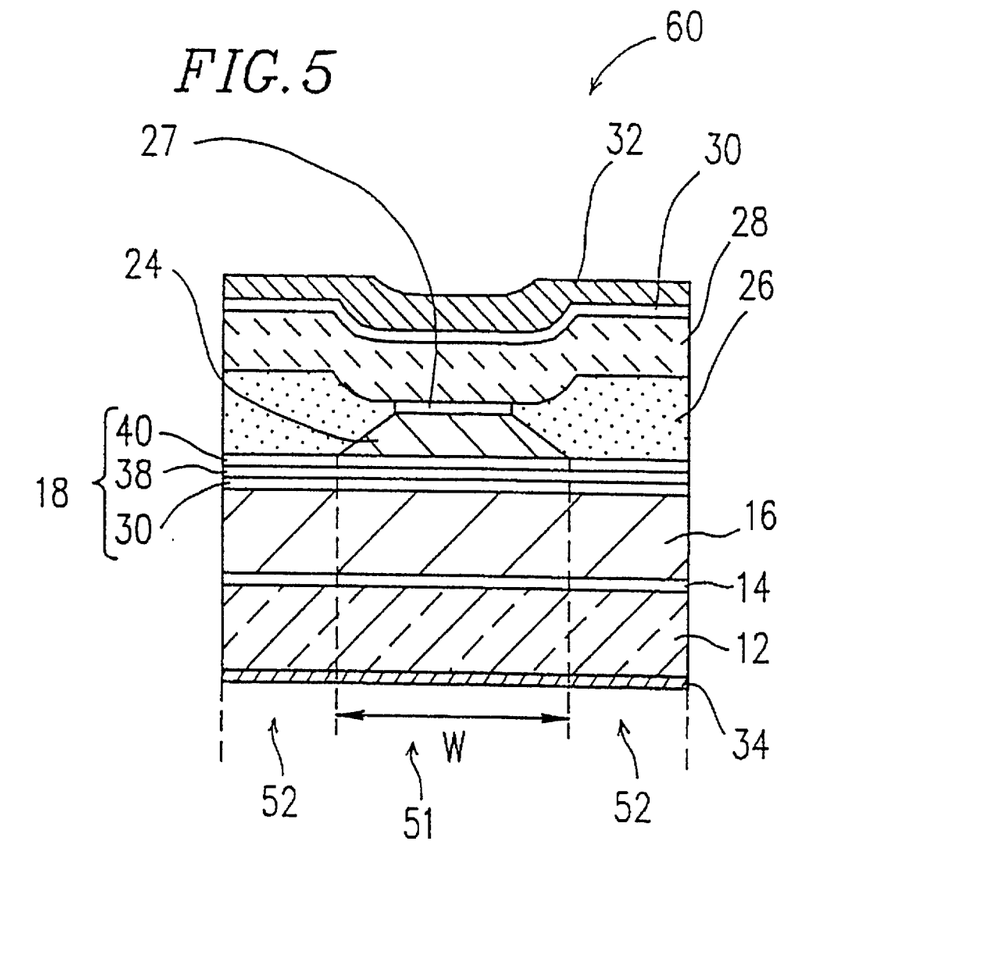
FIG. 5 schematically shows a cross-sectional structure of a semiconductor laser according to Example 2 of the present invention.

FIG. 5 schematically shows a cross-section of a semiconductor laser 60 according to the present invention. In FIG. 5, the same components as those of the semiconductor laser 10 are denoted by the same reference numerals.

The semiconductor laser 60 includes: the semiconductor substrate 12 made of n-type GaAs; the n-type first cladding layer 16 carried by the semiconductor substrate 12 through the buffer layer 14; the strip-shaped p-type second cladding layer 24; and the light-emitting layer 18 interposed between the first cladding layer 16 and the second cladding layer 24.

The light-emitting layer 18 includes the quantum well layer 38, and the first light guiding layer 36 and the second light guiding layer 40 sandwiching the quantum well layer 38 therebetween.

The undoped burying layers 26 are provided on the both sides of the second cladding layer 24, covering the upper face of the light-emitting layer 18 and the side faces of the second cladding layer 24. The first cap layer 27 is formed on the second cladding layer 24. The second cap layer 28 and the contact layer 30 are successively formed on the first cap layer 27 and the burying layer 26 which are formed on the second cladding layer 24. The electrodes 32 and 34 are formed on the upper face of the contact layer 30 and the bottom face of the semiconductor substrate 12, respectively. The composition, concentration of impurity and thickness of each semiconductor laser are the same as those in Table 1 except that the thickness of the second cladding layer 24 is 0.5 µm.

In the semiconductor laser 60, although the upper part of the second cladding layer 24 is slightly concave as shown in FIG. 5, the top surface of the burying layer 26 is smooth.

The semiconductor laser 60 has a refractive index waveguide type structure, and controls confinement of a light beam emitted from the light-emitting layer 18 in a lateral direction based on a difference in effective refractive index between a region 51 below the second cladding layer 24 included in the light-emitting layer 18 and other regions 52. As described below in detail, the lateral mode of an emitted light beam is controlled to be a single mode in the semiconductor laser 60 by controlling a width W of the region 51 and a difference in effective refractive index between the region 51 and the regions 52.

A method for fabricating the semiconductor laser 60 will be described with reference to FIGS. 5 and 6A through 6H.

Figure 6A:
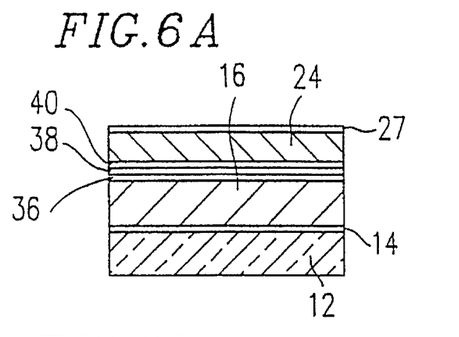
FIGS. 6A to 6H are cross-sectional views showing the processes of fabricating the semiconductor laser shown in FIG. 5.

As shown in FIG. 6A, the buffer layer 14, the first cladding layer 16, the first light guiding layer 36, the quantum well layer 38, the second light guiding layer 40, the second cladding layer 24, and the first cap layer 27 are successively grown on the n-type GaAs semiconductor substrate 12 having (100) plane by epitaxial growth such as molecular beam epitaxy (MBE). Since the semiconductor layers except the quantum well layer 38 lattice-match with the semiconductor substrate 12, an excellent semiconductor layer having little lattice defects and the like can be formed. The quantum well layer 38 does not lattice-match with the semiconductor substrate 12. However, since the quantum well layer 38 is sufficiently thin, it can be formed on the first light guiding layer 36 without causing a lattice defect or misfit dislocation while containing strains therein.

Figure 6B:
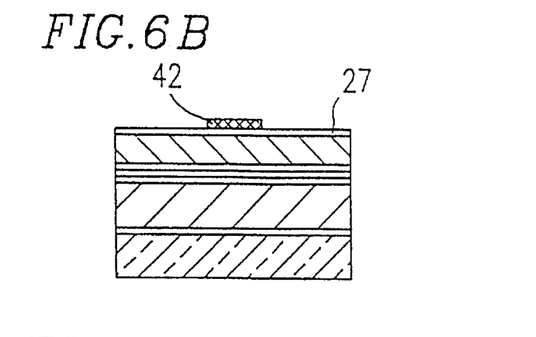

Next, as shown in FIG. 6B, the silicon oxide film 42 is formed on the first cap layer 27 by light-assisted CVD or the like. The silicon oxide film 42 has a stripe-shaped portion whose width W defines the width of the second cladding layer 24. In Example 2, the width W is set at 2 µm. The silicon oxide film 42 is formed so as to extend in a [110] direction or in a direction which is perpendicular to a [110] direction.

Figure 6C:
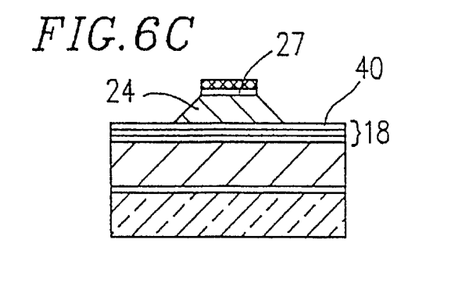

As shown in FIG. 6C, the first cap layer 27 is etched using a mixed solution of potassium dichromate and sulfuric acid by using the silicon oxide film 42 as a mask. Furthermore, the second cladding layer 24 is etched to a depth of about 0.5 µm. Next, the remaining portion of the second cladding layer 24 is etched using a hydrochloric acid type etchant so as to expose the surface of the second light guiding layer 40. As a result, the stripe-shaped second cladding layer 24 is formed.

Figure 6D:
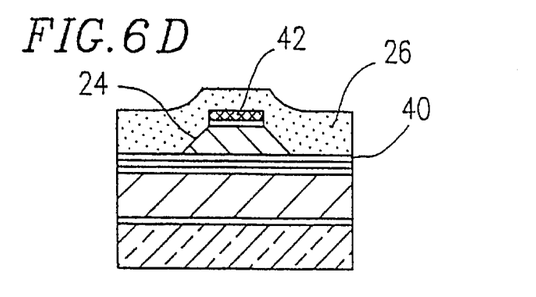

Next, the burying layer 26 is formed. Specifically, the semiconductor substrate 12 is placed in an MBE apparatus again as shown in FIG. 6D, and then the burying layer 26 is epitaxially grown on the exposed second light guiding layer 40. Since the burying layer 26 is made of ZnMgSSe which lattice-matches with $ZnS_{0.07}Se_{0.93}$ constituting the second light guiding layer 40, the burying layer 26 having good crystal quality, in which lattice defect or misfit dislocation scarcely occurs, can be formed. The burying layer 26 is grown until the surface of the silicon oxide film 42 is completely covered. As described in Example 1, the burying layer 26 may be formed by an MOVPE method. In this case, the steps described below with reference to FIGS. 6E and 6G can be omitted.

Figure 6E:
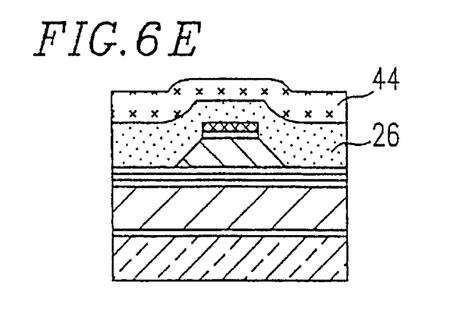
Figure 6F:
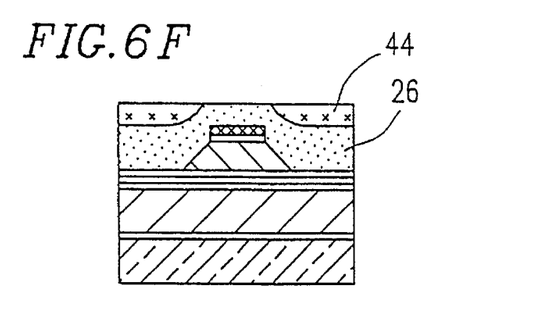
Figure 6G:
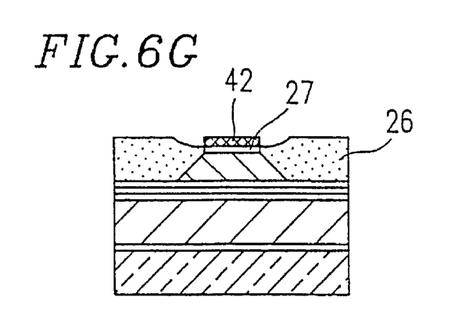

Thereafter, as shown in FIG. 6E, the resist film 44 is formed on the entire surface of the burying layer 26. Then, the resist film 44 is etched from the entire upper surface by oxygen plasma or the like so that the burying layer 26 formed on the silicon oxide film 42 is partially exposed (FIG. 6F). The burying layer 26 is etched using a mixed solution of potassium dichromate and sulfuric acid by using the resist film 44 as a mask so as to remove the burying layer 26 on the silicon oxide film 42 as shown in FIG. 6G.

Figure 6H:
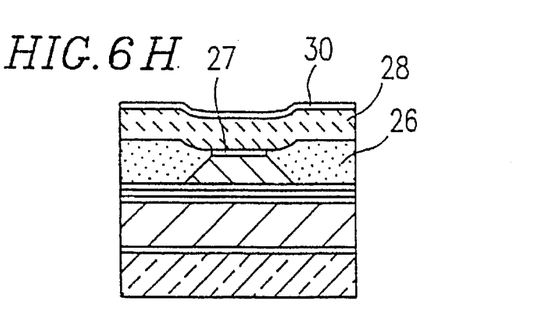

After the first cap layer 27 is exposed by removing the silicon oxide film 42 with aqueous hydrofluoric acid or the like, the semiconductor substrate 12 is placed in the MBE apparatus again. Then, as shown in FIG. 6H, the second cap layer 28 and the contact layer 30 are epitaxially grown on the burying layer 26 and the first cap layer 27 in this order.

Finally, as shown in FIG. 5, for example, an AuGeNi type or an In metal film is formed as the electrode 34, and a PdPtAu type metal film is vapor deposited as the electrode 32. Then, a thermal treatment is conducted if necessary, thereby completing the semiconductor laser 60.

In the semiconductor laser 60, the structure for realizing a single lateral mode is obtained by the same analysis as described in detail in Example 1. Since the semiconductor laser 60 differs from the semiconductor laser 10 in that the third cladding layer is not included, consideration is given while setting the thickness t at zero in FIG. 3.

When compositions x and y of $Zn_{1-x}Mg_xS_{1-y}S_y$ constituting the burying layer 26 are set at about 0.19 and about 0.78, respectively, a refractive index of the burying layer 26 is about 2.55. Therefore, a difference in effective refractive index obtained from the curve f in FIG. 3 is 4×10⁻³. It is understood from the curves $h_0$ and $h_1$ in FIG. 4 that a single mode can be realized with the width W of 2.5 µm or less in this case.

Therefore, in the case where width of the second cladding layer is set at 2 µm in the semiconductor laser 60 described above, stable single mode oscillation can be realized. In this case, a threshold value density is about 320 A/cm$^2$. Therefore, it is understood that the semiconductor laser can be driven at low current.

Moreover, as described in Example 1, in order to set the width W at 1 µm or more, it can be seen from FIG. 4 that the difference in effective refractive index should be less than $1 \times 10^{-2}$. Therefore, as is understood from FIG. 4, in order to allow the semiconductor laser 60 to oscillate in a single mode, when the difference in effective refractive index is $1 \times 10^{-2}$, the width W should be 1 µm≦W≦2.5 µm.

Although the example where the quantum well layer made of $Zn_{0.8}Cd_{0.2}Se$ and the light guiding layer made of $ZnS_{0.07}Se_{0.93}$ are used as the light-emitting layer is described in the above examples, various modifications can be made. For example, a quantum well layer made of $Zn_{1-z}Cd_zSe$ (0≦z<1) and a light guiding layer made of $ZnS_{0.07}Se_{0.93}$ may be used instead. Alternatively, a quantum well layer made of ZnSe and a light guiding layer made of $Zn_{1-x}Mg_xS_{1-y}Se_y$ (0≦x<1, 0≦y<1) may be used.

It is preferable that the cladding layer has a band gap larger than that of the light guiding layer by 0.15 eV or more, preferably, 0.3 eV or more for the purpose of confining carriers therein. In order to realize such a structure, it is preferable that the light guiding layer has a larger composition of Se and the cladding layer has a larger composition of Mg than those of the other in the light guiding layer and the cladding layer which are made of ZnMgSSe.

Although the example where an SCHSQW (Separate Confinement Hetero-structure Single Quantum Well) structure is used as the light-emitting layer is shown, a multi-quantum well structure may be used instead.

Figure 7A:
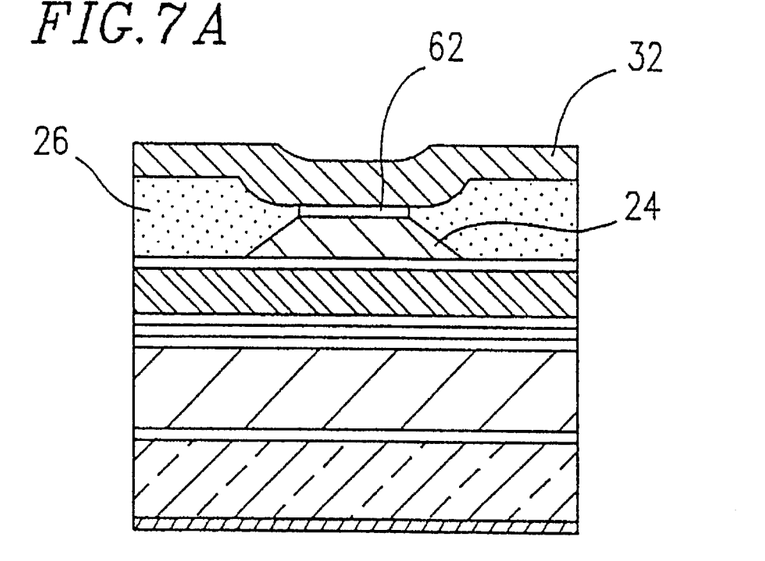
FIGS. 7A and 7B show other examples of the semiconductor laser shown in FIGS. 1 and 2, respectively.
Figure 7B:
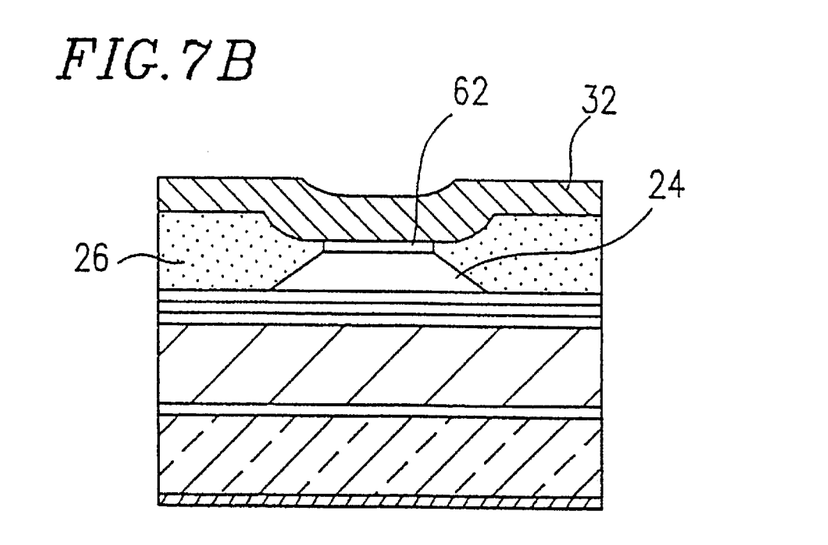

Furthermore, the second cap layer 28 is formed so as to allow the semiconductor laser to be easily mounted face-down with high reliability in the above examples. However, as shown in FIGS. 7A and 7B, the second cap layer 28 can be omitted if a contact layer 62 consisting of a p-ZnTe layer and a p-ZnSe/p-ZnTe multi-quantum well layer is formed on the second cladding layer. In such a case, it is sufficient that the electrode 32 is formed after the burying layer 26 is formed and then the contact layer 62 is exposed. Therefore, a burying growth process can be conducted in a single step.

Figure 8:
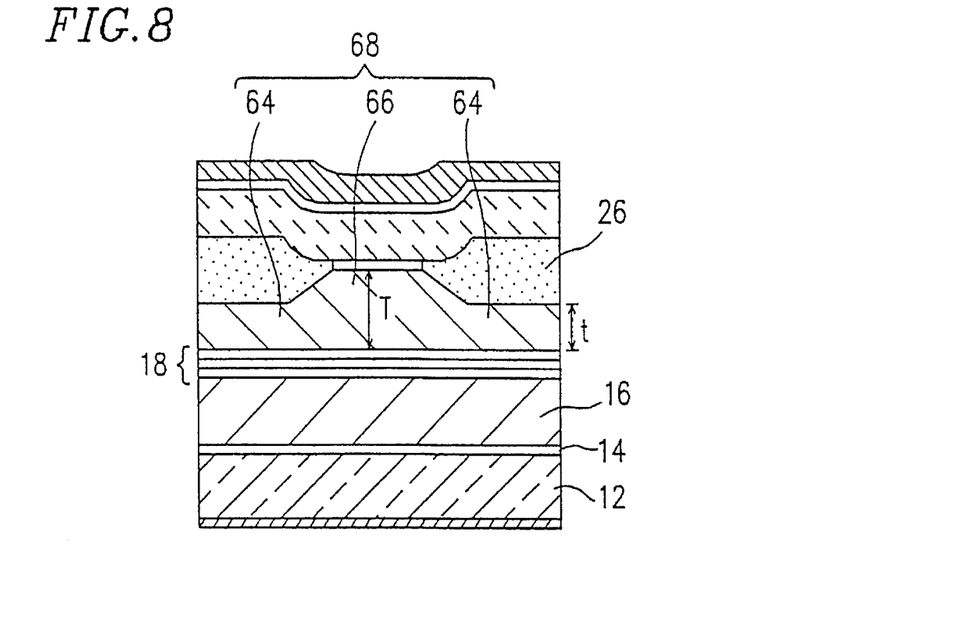
FIG. 8 shows another example of the semiconductor laser shown in FIG. 1.

Moreover, as described in Example 1, the second and the third cladding layers are not necessarily separately formed layers. As shown in FIG. 8, the same effect as that of Example 1 can be obtained even if a cladding layer 68 having a stripe-shaped ridge 66 is formed on the light-emitting layer 18. In such a case, the cladding layer having a thickness T corresponding to the thickness of the ridge 66 is formed on the light-emitting layer. Then, the ridge 66 is formed by etching. The thickness t of regions 64 partitioned by the ridge 66 corresponds to the thickness of the third cladding layer.

As is apparent from the above description, since the semiconductor laser includes the epitaxially grown burying semiconductor layer, it is possible to form a thick burying layer for burying a large step difference and smooth the upper face of the semiconductor laser. It is possible to mount the semiconductor laser of the present invention in a face-down manner.

Furthermore, by using the semiconductor layers having a small heat resistance, in the case where the semiconductor laser is mounted facedown, the heat radiating properties can be improved as compared with a conventional burying layer using a resin. Therefore, the semiconductor laser is inhibited from being deteriorated by heat with elapse of time, resulting in higher reliability of the semiconductor laser.

Moreover, since ZnMgSSe, which is the same material as the semiconductor material constituting the semiconductor laser and is capable of lattice-matching with the substrate, is used as a burying material, the semiconductor layer in contact with the burying layer is not adversely affected.

Furthermore, since a high resistance such as about $10^4 \Omega$ is obtained with undoped ZnMgSSe, the burying layer itself can prevent a current from flowing. Therefore, a current-restricting structure can be provided by forming the burying layer made of undoped ZnMgSSe so as to be in contact with any one of a p-type semiconductor layer and an n-type semiconductor layer or an undoped layer such as a light-emitting layer. With the obtained current-restricting structure, a larger degree of freedom of the device structure is obtained and a simpler fabrication process can be used as compared with a conventional current-restricting structure using a p-n junction.

Furthermore, by optimizing the refractive index waveguide mechanism and processing substantially the same stripe structure as that of a conventional semiconductor laser, the semiconductor laser can operate in a single mode. Therefore, a refractive index waveguide type single mode semiconductor laser having a low threshold value current and high reliability can be realized.

According to the present invention, a semiconductor laser with high reliability which can be mounted facedown is obtained. In addition, the semiconductor laser which is capable of operating at a low threshold value current density and stably and continuously oscillating in a single mode.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor laser comprising:

a semiconductor substrate;

a first cladding layer made of a first conductivity type ZnMgSSe, which is held by the semiconductor substrate and lattice-matches with the semiconductor substrate;

a stripe-shaped second cladding layer made of a second conductivity type ZnMgSSe lattice-matching with the semiconductor substrate;

a light-emitting layer including a first and a second light guiding layers made of $Zn_{1-x}Mg_xS_{1-y}Se_y$ (0≦x<1, 0≦y<1) and a quantum well layer made of $Zn_{1-z}Cd_zSe$ (0≦z<1) which is interposed between the first and the second light guiding layers, the light-emitting layer being interposed between the first and the second cladding layers; and a burying layer which is made of ZnMgSSe lattice-matching with the semiconductor substrate and formed on sides of the second cladding layer.

2. A semiconductor laser according to claim 1, further comprising a third cladding layer which is made of the second conductivity type ZnMgSSe lattice-matching the semiconductor substrate and provided between the second cladding layer and the light-emitting layer.

3. A semiconductor laser according to claim 2, wherein the second cladding layer has a width in a range of 1 µm to 2 μm in a direction perpendicular to a direction in which the stripe-shaped second cladding layer extends, and a difference in effective refractive index between a region below the second cladding layer and the other region in the light-emitting layer is $1.0 \times 10^{-2}$ or less.

4. A semiconductor laser according to claim 2, wherein the second cladding layer has a width in a range of 1 μm to 4 μm in a direction perpendicular to a direction in which the stripe-shaped second cladding layer extends, and a difference in effective refractive index between the region below the second cladding layer and the other region in the light-emitting layer is $2.0 \times 10^{-3}$ or less.

5. A semiconductor laser according to claim 2, further comprising a ZnSe layer between the second cladding layer and the third cladding layer.

6. A semiconductor laser according to claim 2, wherein the first, the second and the third cladding layers are made of $Zn_{1-x'}Mg_{x'}S_{1-y'}Se_{y'}$ ($0 \leq x' < 1$, $0 \leq y' < 1$) and satisfy $x < x'$ and $y > y'$.

7. A semiconductor laser according to claim 6, wherein the first, the second and the third cladding layers have a band gap which is larger than that of the first and the second light guiding layers by 0.15 eV or more.

8. A semiconductor laser according to claim 1, wherein the burying layer is made of undoped ZnMgSSe.

9. A semiconductor laser according to claim 1, wherein the burying layer has a refractive index smaller than that of the second cladding layer.

10. A semiconductor laser according to claim 1, wherein the second cladding layer has a width in a range of 1 μm to 2.5 μm in a direction perpendicular to a direction in which the stripe-shaped second cladding layer extends, and a difference in effective refractive index between the region below the second cladding layer and the other region in the light-emitting layer is $4.0 \times 10^{-3}$ or less.

11. A semiconductor laser according to claim 1, wherein the first and the second cladding layers are made of $Zn_{1-x'}Mg_{x'}S_{1-y'}Se_{y'}$ ($0 \leq x' < 1$, $0 \leq y' < 1$) and satisfy $x < x'$ and $y > y'$.

12. A semiconductor laser according to claim 11, wherein the first and the second cladding layers have a band gap which is larger than that of the first and the second light guiding layers by 0.15 eV or more.

13. A semiconductor laser according to claim 1, wherein the quantum well layer is made of CdZnSe, and the first and the second light guiding layers are made of $ZnS_{0.07}Se_{0.93}$.

14. A semiconductor laser comprising:

a semiconductor substrate;

a first cladding layer made of a first conductivity type ZnMgSSe, which is held by the semiconductor substrate and lattice-matches with the semiconductor substrate;

a second cladding layer including a stripe-shaped ridge, which is made of a second conductivity type ZnMgSSe lattice-matching with the semiconductor substrate;

a light-emitting layer having a first and a second light guiding layers made of $Zn_{1-x}Mg_xS_{1-y}Se_y$ ($0 \leq x < 1$, $0 \leq y < 1$) and a quantum well layer made of $Zn_{1-z}Cd_zSe$ ($0 \leq z < 1$) which is interposed between the first and the second light guiding layers, the light-emitting layer being interposed between the first and the second cladding layers; and a burying layer which is made of ZnMgSSe lattice-matching with the semiconductor substrate and formed on sides of the second cladding layer.

* * * * *